United States Patent
Oberlin et al.

(10) Patent No.: US 7,038,308 B2
(45) Date of Patent: May 2, 2006

(54) MULTI-PATH BAR BOND CONNECTOR FOR AN INTEGRATED CIRCUIT ASSEMBLY

(75) Inventors: Gary E. Oberlin, Windfall, IN (US); Todd P. Oman, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 60 days.

(21) Appl. No.: 10/919,864

(22) Filed: Aug. 17, 2004

(65) Prior Publication Data
US 2006/0038265 A1 Feb. 23, 2006

(51) Int. Cl.
*H01L 23/48* (2006.01)
(52) U.S. Cl. ..................................... 257/693
(58) Field of Classification Search ............... 257/666, 257/693; 439/69
See application file for complete search history.

(56) References Cited

U.S. PATENT DOCUMENTS

| | | | | |
|---|---|---|---|---|
| 5,359,224 A | * | 10/1994 | Heinen et al. | 257/666 |
| 5,495,125 A | * | 2/1996 | Uemura | 257/666 |
| 5,872,403 A | | 2/1999 | Bowman et al. | 257/780 |
| 6,083,772 A | | 7/2000 | Bowman et al. | 438/106 |
| 6,307,755 B1 | * | 10/2001 | Williams et al. | 361/813 |
| 6,528,880 B1 | * | 3/2003 | Planey | 257/735 |
| 6,566,749 B1 | * | 5/2003 | Joshi et al. | 257/706 |
| 6,593,527 B1 | | 7/2003 | Brandenburg et al. | 174/52.1 |
| 6,777,786 B1 | * | 8/2004 | Estacio | 257/666 |
| 2003/0052408 A1 | * | 3/2003 | Quinones et al. | 257/737 |
| 2003/0075786 A1 | * | 4/2003 | Joshi et al. | 257/676 |

* cited by examiner

*Primary Examiner*—Matthew Smith
*Assistant Examiner*—Lex H. Malsawma
(74) *Attorney, Agent, or Firm*—Stefan V. Chmielewski

(57) ABSTRACT

A solderable bar bond connector establishes a primary interconnect between a substrate and a high current terminal of an IC chip mounted on the substrate, and one or more secondary interconnects between the substrate and low current terminals of the IC chip. The bar bond connector includes a plate portion soldered to the high current terminal of the IC chip and a plurality of leg elements extending from the plate portion to multiple bond sites on the substrate. The underside of at least one leg element is provided with a secondary circuit including a conductor that is electrically isolated from the respective leg element. The conductor of the secondary circuit is soldered to both the substrate and a low current terminal of the IC chip for establishing a secondary interconnect in addition to the primary interconnect established by the plate portion and the other leg elements.

11 Claims, 3 Drawing Sheets

MULTI-PATH BAR BOND CONNECTOR FOR AN INTEGRATED CIRCUIT ASSEMBLY

TECHNICAL FIELD

The present invention is directed to a bar bond connector for electrically coupling integrated circuit terminals to a substrate on which the integrated circuit is mounted, and more particularly to a bar bond connector that provides two or more electrically isolated connections between the integrated circuit and the substrate.

BACKGROUND OF THE INVENTION

In many high power electronic applications, it can be cost effective to mount an integrated circuit (IC) chip such as a power transistor directly on a substrate, and to form electrical interconnects between the substrate and conductor pads (also referred to as bond sites) located on the exposed surface of the IC chip. Traditionally, the electrical interconnects have been achieved by wire bonding, with multiple wire bonds per interconnect in cases where high current is required. However, there are cost concerns associated with wire bonding, and it is more attractive in many cases to form the high current interconnects with soldered bar bond connectors, as described for example in the U.S. Pat. Nos. 5,872,403; 6,083,772; and 6,593,527. Essentially, a bar bond connector is simply a strap or bar of solderable highly conductive material such as copper that is preformed to bridge the space between a bond site on the IC chip and a bond site on the substrate adjacent the IC chip. The bar bond connectors can be designed for automated assembly to reduce cost, and provide decreased interconnect resistance and increased interconnect current capacity compared to wire bonding. As shown in the aforementioned U.S. Pat. No. 6,593,527, the bar bond may include a stress relief loop and/or openings intermediate the substrate and the IC chip to increase compliancy so that temperature-related stress tends to be absorbed by flexure of the bar bond connector instead of the solder joints at either end of the bar bond connector.

SUMMARY OF THE INVENTION

The present invention is directed to an improved solderable bar bond connector that is particularly well adapted for use with IC chips such as power transistors that require both high current and low current interconnects to a substrate. Additionally, the bar bond connector is configured for optimal stress relief at solder joints connecting it to the chip and the substrate.

A bar bond connector according to the present invention establishes a primary interconnect between the substrate and a high current terminal of the IC chip, and one or more secondary interconnects between the substrate and low current terminals of the IC chip. The bar bond connector includes a plate portion soldered to the high current terminal of the IC chip and a plurality of leg elements extending from the plate portion to multiple bond sites on the substrate. The underside of at least one leg element is provided with a secondary circuit including a conductor that is electrically isolated from the respective leg element. The conductor of the secondary circuit is soldered to both the substrate and a low current terminal of the IC chip for establishing a secondary interconnect in addition to the primary interconnect established by the plate portion and the other leg elements. In a preferred implementation, the leg elements extend separately from the plate portion, and the bar bond connector includes a tie bar for mechanically interconnecting the leg elements near the substrate solder joints.

BRIEF DESCRIPTION OF THE DRAWINGS

The present invention will now be described, by way of example, with reference to the accompanying drawings, in which:—

DESCRIPTION OF THE PREFERRED EMBODIMENT

Figure 1:
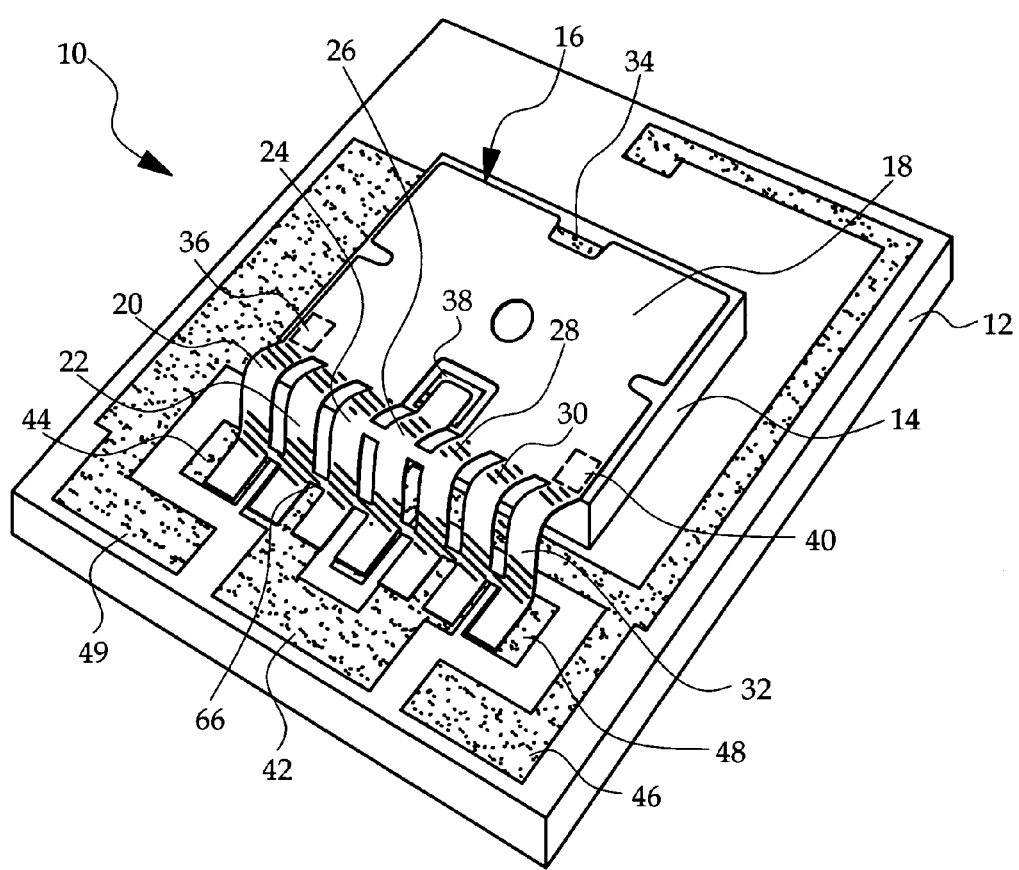
FIG. 1 depicts an integrated circuit assembly including a substrate, an IC chip and a bar bond connector according to this invention.

Referring to the drawings, and particularly to FIG. 1, the reference numeral 10 generally designates an integrated circuit assembly including a circuit board or substrate 12, a bare-die IC chip 14 and a bar bond connector 16 for forming electrical interconnections between bond sites formed on the IC chip 14 and the substrate 12. The bar bond connector 16 includes a plate portion 18 that is placed atop the IC chip 14 and a number of leg elements 20, 22, 24, 26, 28, 30, 32 integral with plate portion 18 and extending from plate portion 18 to multiple bond sites on the substrate 12. In the illustrated embodiment, the substrate 12 is a ceramic substrate, the IC chip 14 is a semiconductor power device such as an IGBT or FET, and the bar bond connector 16 is formed of a highly conductive metal such as copper.

In most high power applications, the IC chip 14 will have two high current terminals and one or more low current terminals. One of the high current terminals, a FET drain for example, is formed on the lower face of the chip 14, and is soldered to a conductor pad 49 formed on the substrate 12. The other terminals, including a second high current terminal 34 (such as a FET source) and one or more low current terminals 36, 38, 40, are formed on the upper or exposed face of chip 14 and must be individually connected to corresponding conductor pads 42, 44, 46, 48 formed on the substrate 12 adjacent the chip 14. In conventional practice, the interconnects between the chip terminals 34, 36, 38, 40 and substrate pads 42, 44, 46, 48 are established by individual wire bonds or bar bond connectors, as disclosed in the aforementioned U.S. Pat. No. 5,872,403, for example. In contrast, a single bar bond connector according to the present invention can be used to form not only the primary interconnect between high current terminal 34 and substrate pad 42, but also the secondary interconnects between the low current terminals 36, 38, 40 and the respective substrate pads 44, 46, 48. This is achieved by forming secondary circuits on the underside of selected leg elements, each such secondary circuit including a conductor that is electrically isolated from the respective leg element, as described below in reference to FIGS. 2–3. In the embodiment of FIG. 1, the high current terminal 34 is coupled to the substrate pad 42 by the plate portion 18 and the bar bond leg elements 22, 24, 28 and 30; the low current terminal 36 is coupled to the substrate pad 44 by a secondary circuit 50 formed on the underside of the leg element 20; the low current terminal 38 is coupled to the substrate pad 46 by a secondary circuit 52 formed on the underside of the leg element 26; and the low current terminal 40 is coupled to the substrate pad 48 by a secondary circuit 54 formed on the underside of the leg element 32.

Figure 2:
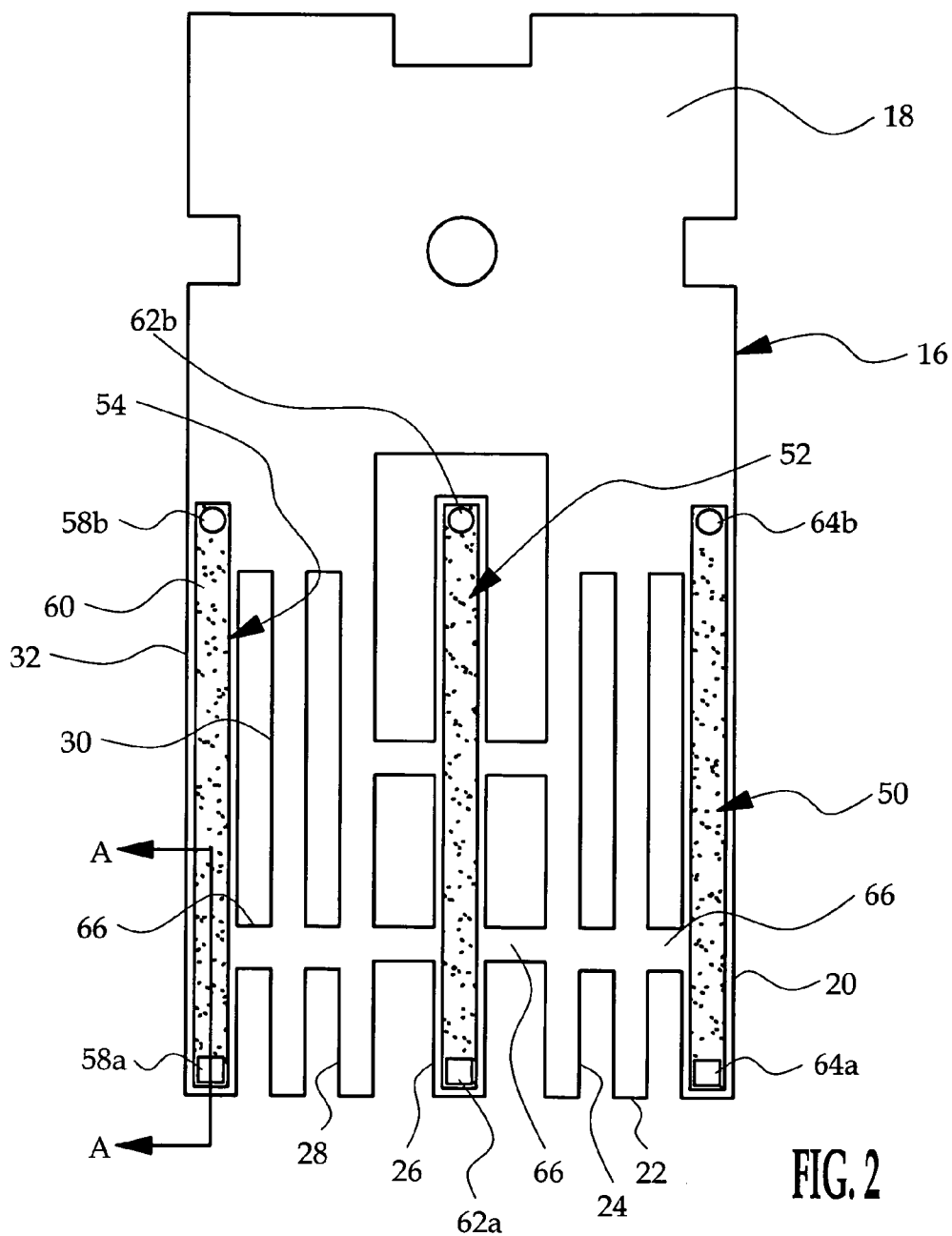
FIG. 2 depicts the underside of the bar bond connector of FIG. 1 prior to formation, including three secondary circuits according to this invention.
Figure 3:
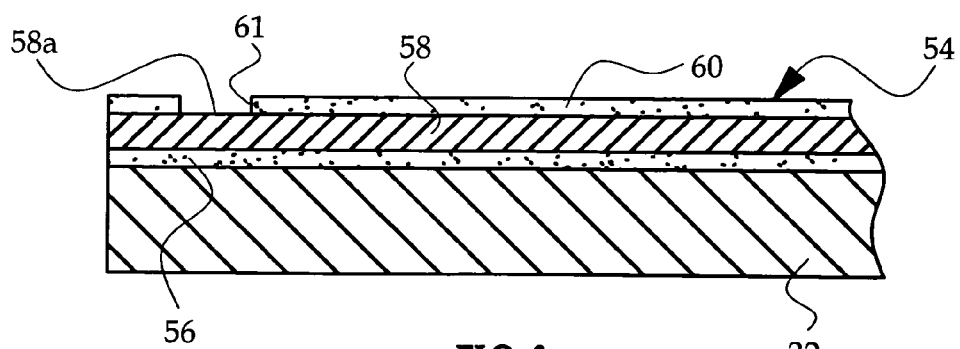
FIG. 3 is a cross-sectional view of the bar bond connector of FIG. 2, taken along lines A—A in FIG. 2.
Figure 4:
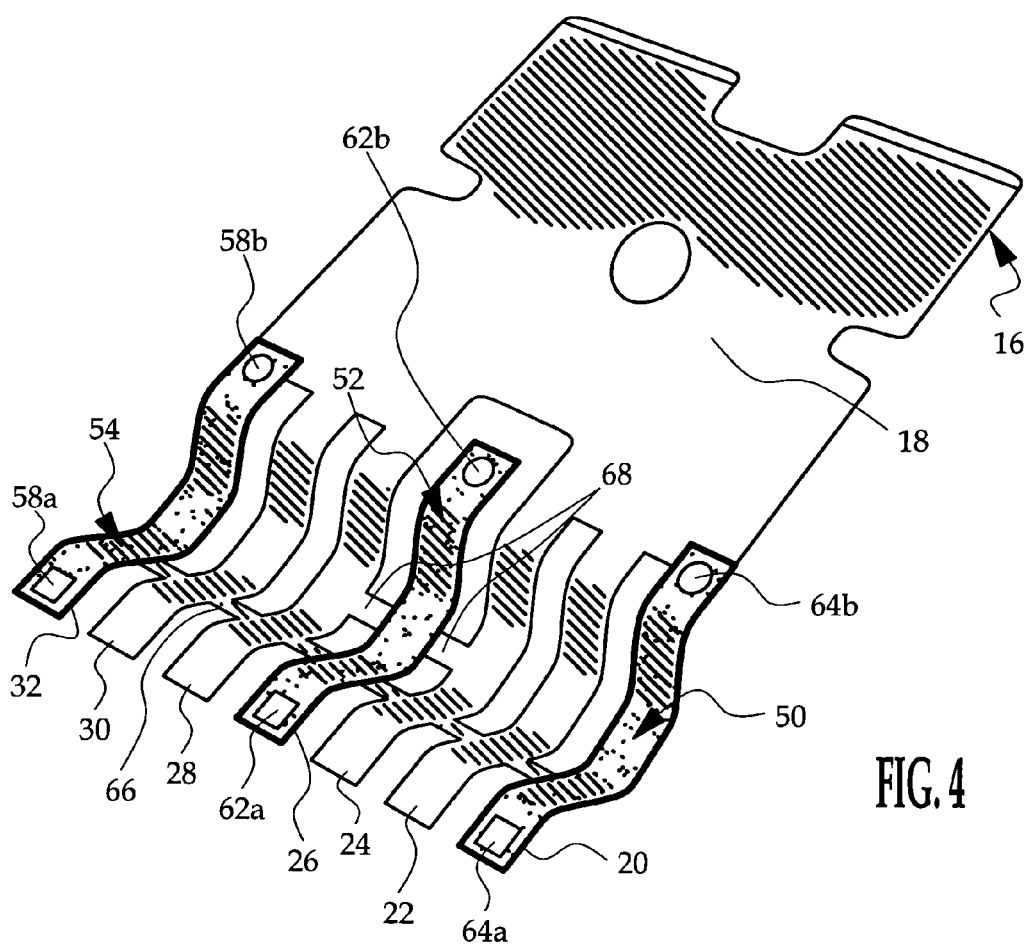
FIG. 4 depicts the bar bond connector of FIG. 2 following formation.

The secondary circuits 50, 52, 54, variously depicted in FIGS. 2–4, are concurrently formed and identical in construction. In the illustrated embodiment, the lengths of the secondary circuits 50, 52, 54 are the same, but it should be understood that their lengths and course may vary depending of the location of the low current terminals of the IC chip 14. As shown in the cross-sectional view of FIG. 3, secondary circuit 54 includes three layers: a base insulating layer 56, a conductor layer 58 and a top insulating layer 60. Portions of the top insulating layer 60 are removed near the ends of the secondary circuit, as designated in FIG. 3 by the reference numeral 61 to form solderable bond sites 58a, 58b on the conductor layer 58. Similarly, bond sites 62a, 62b are formed on the conductor layer of secondary circuit 52, and bond sites 64a, 64b are formed on the conductor layer of secondary circuit 50. In each case, the respective base and top insulating layers electrically insulate the intermediate conductor layer from all but the respective bond sites.

The bar bond connector 16 is initially formed from flat metal stock, resulting in a structure such as shown in FIG. 2. Thereafter, the leg elements 20–32 are bent in curved fashion as shown in FIGS. 1 and 4 to provide a stress relief loop between the IC chip 14 and the bond sites 42–48 on substrate 12. The secondary circuits 50, 52, 54 may be formed on the respective leg elements 20, 26, 32 either prior to or after formation of the stress relief loop. In a preferred embodiment, the secondary circuits 50–54 are separately manufactured in the form of flexible circuits, and then attached to the respective bar bond leg elements 20, 26, 32 by a suitable adhesive. In this approach, the insulating layers comprise a typical flexible circuit material such as polyester or polyimide, and the conductor layers comprise copper foil deposited on one of the insulating layers. Alternatively, the secondary circuits 50–54 may be formed directly on the leg elements 20, 26, 32 by a thermal spray process in which the insulating layers comprise alumina, and the conductor layers comprise copper.

In the manufacture of the integrated circuit assembly 10, the bar bond connector 16 is soldered to the IC chip 14 and the substrate 12 to establish the primary and secondary interconnects. The primary interconnect is established by soldering the plate portion 18 to the high current terminal 34 of the IC chip 14, and the leg elements 22, 24, 28, 30 to the substrate bond site 42. The secondary interconnect between low current terminal 36 of IC chip 14 and substrate bond site 44 is established by forming a first solder joint between substrate bond site 44 and bond site 64a of secondary circuit 50, and a second solder joint between low current terminal 36 and bond site 64b of secondary circuit 50. Similarly, the secondary interconnect between low current terminal 38 and substrate bond site 46 is established by forming a first solder joint between substrate bond site 46 and bond site 62a of secondary circuit 52, and a second solder joint between low current terminal 38 and bond site 62b of secondary circuit 52. And lastly, the secondary interconnect between low current terminal 40 and substrate bond site 48 is established by forming a first solder joint between substrate bond site 48 and bond site 58a of secondary circuit 54, and a second solder joint between low current terminal 38 and bond site 58b of secondary circuit 54. It is intended, of course, that the various solder joints be formed concurrently in a conventional solder reflow process.

It will be noted that the bar bond connector 16 of the present invention also differs structurally from other bar bond connectors in that the leg elements 20–32 extend individually from the plate portion 18 to the respective substrate bond sites 42–48. This optimizes the degree of stress relief provided by the respective stress relief loops in the leg elements 20–32, minimizing temperature-related stress at the various solder joints. A thin tie bar 66 mechanically interconnects the leg elements 20–32 at a point remote from the plate portion 18 to enhance the mechanical integrity of the bar bond connector 16 prior to its installation in the assembly 10 without significantly degrading the solder joint stress relief provided by the stress relief loop. In the illustrated embodiment, a secondary tie bar 68 mechanically interconnects the leg element 26 to the adjacent leg elements 24 and 28 since the leg element 26 is not directly supported by the plate portion 18.

In summary, the bar bond connector of the present invention provides a simple and very cost effective way of establishing multi-path interconnects between an IC chip 14 and adjacent substrate bond sites with a single part. The time and complexity of manufacture are significantly reduced, contributing to significant cost reduction, compared with prior interconnect technologies.

While the invention has been described in reference to the illustrated embodiment, it should be understood that various modifications in addition to those mentioned above will occur to those skilled in the art. For example, multiple secondary circuits may be used to couple a single bond site on an IC chip to a corresponding substrate bond site, leg elements may extend from more than one edge of the plate portion 18, and so on. Accordingly, it is intended that the invention not be limited to the disclosed embodiment, but that it have the full scope permitted by the language of the following claims.

The invention claimed is:

1. A bar bond connector for an electronic assembly including an IC chip mounted on a substrate, at least first and second terminals formed on an exposed face of said IC chip and at least first and second conductor pads formed on said substrate adjacent said IC chip, said bar bond connector comprising:

a conductive plate disposed on the exposed face of said IC chip and electrically connected to said first terminal;

a first leg element integral with said conductive plate, extending from said conductive plate, terminating in proximity to said first conductor pad, and electrically connected to said first conductor pad;

a second leg element integral with said conductive plate, extending from said conductive plate and terminating in proximity to said second conductor pad; and a secondary circuit affixed to said second leg element but electrically isolated therefrom, said secondary circuit including a conductor having a first end electrically connected to said second terminal, and a second end electrically connected to said second conductor pad.

2. The bar bond connector of claim 1, wherein the second end of said conductor is disposed between said second conductor pad and said second leg element.

3. The bar bond connector of claim 1, wherein the first end of said conductor is disposed between said conductive plate and said said second terminal.

4. The bar bond connector of claim 1, wherein said secondary circuit comprises:

a first strip of insulative material affixed to said second leg element;

a strip of conductive material affixed to said first strip of insulative material and defining said conductor; and a second strip of insulative material affixed to said strip of conductive material opposite said first strip of insulative material.

5. The bar bond connector of claim 4, wherein said secondary circuit includes first and second openings in said second strip of insulative material to expose said strip of conductive material for electrical connection to said second terminal and said second conductor pad.

6. The bar bond connector of claim 4, wherein said secondary circuit is a flexible circuit affixed to said second leg element with adhesive.

7. The bar bond connector of claim 4, wherein said secondary circuit is a coating deposited on said second leg element.

8. The bar bond connector of claim 1, wherein said first and second leg elements extend individually from said conductive plate, said bar bond connector further comprising a tie bar mechanically interconnecting said first and second leg elements at a point remote from said conductive plate.

9. A bar bond connector for an electronic assembly including an IC chip mounted on a substrate, at least first and second terminals formed on an exposed face of said IC chip and at least first and second conductor pads formed on said substrate adjacent said IC chip, said bar bond connector comprising:

a conductive plate disposed on the exposed face of said IC chip;

at least first and second leg elements integral with said conductive plate, extending from said conductive plate to points in proximity to said first and second conductor pads, respectively;

first and second solder joints electrically coupling said conductive plate to said first terminal, and said first leg element to said first conductor pad, respectively;

a secondary circuit affixed to said second leg element but electrically isolated therefrom, including a conductor; and third and fourth solder joints electrically coupling said conductor to said second terminal and said second conductor pad, respectively.

10. The bar bond connector of claim 9, wherein said secondary circuit includes an insulator surrounding said conductor, said insulator having a first opening between said conductor and said second terminal and a second opening between said conductor and said second conductor pad.

11. The bar bond connector of claim 9, wherein said first and second leg elements extend individually from said conductive plate, said bar bond connector further comprising a tie bar mechanically interconnecting said first and second leg elements at a point remote from said conductive plate.

* * * * *